United States Patent
Behler

(10) Patent No.: US 7,066,373 B2
(45) Date of Patent: Jun. 27, 2006

(54) METHOD FOR ALIGNING THE BONDHEAD OF A DIE BONDER

(75) Inventor: Stefan Behler, Steinhausen (CH)

(73) Assignee: Unaxis International Trading Ltd, Cham (CH)

( * ) Notice: Subject to any disclaimer, the term of this patent is extended or adjusted under 35 U.S.C. 154(b) by 30 days.

(21) Appl. No.: 10/937,991

(22) Filed: Sep. 10, 2004

(65) Prior Publication Data

US 2005/0061852 A1    Mar. 24, 2005

(30) Foreign Application Priority Data

Sep. 22, 2003    (CH) .................................. 1613/03

(51) Int. Cl.
*B23K 31/02*    (2006.01)
(52) U.S. Cl. ................... 228/103; 156/64; 700/121
(58) Field of Classification Search ............ 228/103, 228/8, 12
See application file for complete search history.

(56) References Cited

U.S. PATENT DOCUMENTS

| | | | |
|---|---|---|---|
| 5,212,880 A | | 5/1993 | Nishiguchi et al. |
| 5,262,355 A | | 11/1993 | Nishiguchi et al. |
| 5,278,634 A | | 1/1994 | Skunes et al. |
| 5,459,794 A | * | 10/1995 | Ninomiya et al. .......... 382/145 |
| 5,547,537 A | | 8/1996 | Reynolds et al. |
| 5,838,754 A | * | 11/1998 | Gorbics et al. ............... 377/20 |
| 6,030,275 A | * | 2/2000 | Lofaro ........................... 451/5 |
| 6,179,938 B1 | | 1/2001 | Mannhart et al. |
| 6,337,221 B1 | * | 1/2002 | Kim et al. ..................... 438/15 |
| RE38,025 E | * | 3/2003 | Skunes et al. .............. 356/400 |
| 6,608,320 B1 | * | 8/2003 | Skunes et al. ......... 250/559.19 |
| 6,791,686 B1 | * | 9/2004 | Finarov ...................... 356/399 |
| 2003/0101576 A1 | | 6/2003 | Hartmann |

FOREIGN PATENT DOCUMENTS

| | | |
|---|---|---|
| EP | 0 462 596 | 12/1991 |
| JP | 0 501 3997 | 1/1993 |
| WO | 92 14988 | 9/1992 |

* cited by examiner

*Primary Examiner*—Jonathan Johnson
(74) *Attorney, Agent, or Firm*—Thelen Reid & Priest LLP; David B. Ritchie

(57) ABSTRACT

In order to eliminate the inclination of a semiconductor chip picked by a gripper, the height of at least three points on the underneath of the semiconductor chip is determined in relation to a reference surface and from this the inclination is calculated. Determining the heights takes place in that the semiconductor chip is lowered until the semiconductor chip comes into contact with a needle.

2 Claims, 2 Drawing Sheets

METHOD FOR ALIGNING THE BONDHEAD OF A DIE BONDER

PRIORITY CLAIM

The present application claims priority under 35 U.S.C § 119 based upon Swiss Patent Application No. 01613/03 filed on Sep. 22, 2003, the disclosure of which is herein incorporated by reference.

FIELD OF THE INVENTION

The invention concerns a method for aligning the bondhead of a Die Bonder.

BACKGROUND OF THE INVENTION

A Die Bonder is a machine that bonds a semiconductor chip onto a carrier material, in particular onto a leadframe. Such a machine is described for example in U.S. Pat. No. 5,212,880. In order that the subsequent wire bonding can take place without difficulty, the spatial position of the bondhead of the Die Bonder has to be set in such a way that the semiconductor chip is bonded plane-parallel onto the carrier material within defined tolerances of a few micrometers. An inclination of the semiconductor chip is designated in technical jargon as tilt. To eliminate the inclination, two adjusting screws are present on the bondhead that enable the bondhead to be turned on two orthogonal axes. The bondhead contains a gripper for accepting the semiconductor chip that can be raised and lowered in relation to the bondhead. The gripper is available in different designs whereby grippers with a nozzle made of rubber known as a "rubber tool" are quite common. After each exchange of the rubber nozzle, the bondhead has to be readjusted, as the rubber nozzles can not be manufactured with the necessary accuracy. Today, the following three methods are known for measuring the inclination of the semiconductor chips:

a) A ruler is attached to the bondhead. The bondhead is lowered over the process support until only a minimum gap exists between the ruler and the process support. An operator observes the gap and manipulates the adjusting screws of the bondhead until the height of the gap is uniform. With this method, it is not the inclination of the semiconductor chip that is measured but the inclination of an adjustment gauge that is attached to the bondhead and not to the rubber nozzle. Furthermore, the achievable accuracy is dependent on the operator.

b) The inclination is only determined with the aid of a microscope after bonding a semiconductor chip. This method is time consuming.

c) Adjustment of the bondhead takes place by means of a process and a sensor as is described in the U.S. Pat. No. 6,179,938. This method is hardly suitable for semiconductor chips with small dimensions.

The object of the invention is to develop a method with which the bondhead of a Die Bonder can be adjusted in a simple way.

BRIEF DESCRIPTION OF THE INVENTION

To solve the above-named task, the invention suggests a method with which the height of at least three points on the underneath of the semiconductor chip is determined in relation to a reference surface and from this the inclination is calculated. Determining the heights is done in that the semiconductor chip is lowered until the semiconductor chip comes into contact with a needle. With this process, preferably the heights of the four corners of the semiconductor chip are determined.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
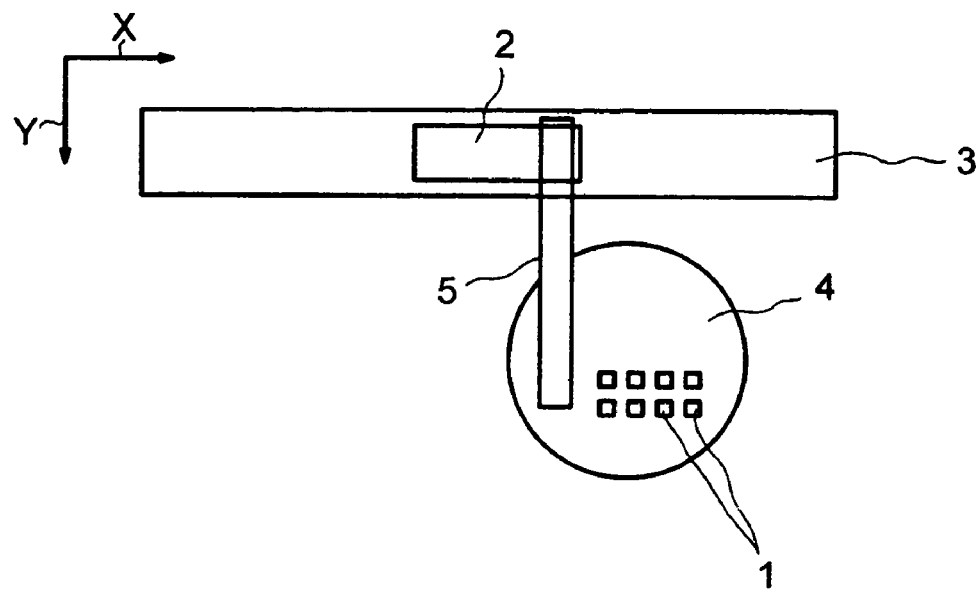
FIG. 1 shows a schematic plan view of a Die Bonder.

FIG. 1 shows a schematic plan view of a Die Bonder for placing semiconductor chips 1 onto a substrate 2. The three co-ordinate axes of a Cartesian system of co-ordinates are designated with x, y and z, whereby the z axis corresponds to the vertical direction. The Die Bonder comprises a transport system 3 for transporting the substrate in x direction and, optionally, also in y direction. A suitable transport system 3 is described for example in the U.S. Pat. No. 5,163,222. The semiconductor chips 1 are preferably presented on a wafer table 4. A Pick and Place system 5 with a bondhead picks one semiconductor chip 1 after the other from the wafer table 4, transports it to the substrate 2 and places it onto the substrate 2.

In order that the semiconductor chips 1 are bonded plane-parallel onto the substrate 2, the bondhead of the Die Bonder is adjusted before starting the assembly process. With this adjustment, the bondhead is set in relation to two parallel running axes so that the picked semiconductor chip runs plane-parallel to a horizontal plane.

Figure 2:
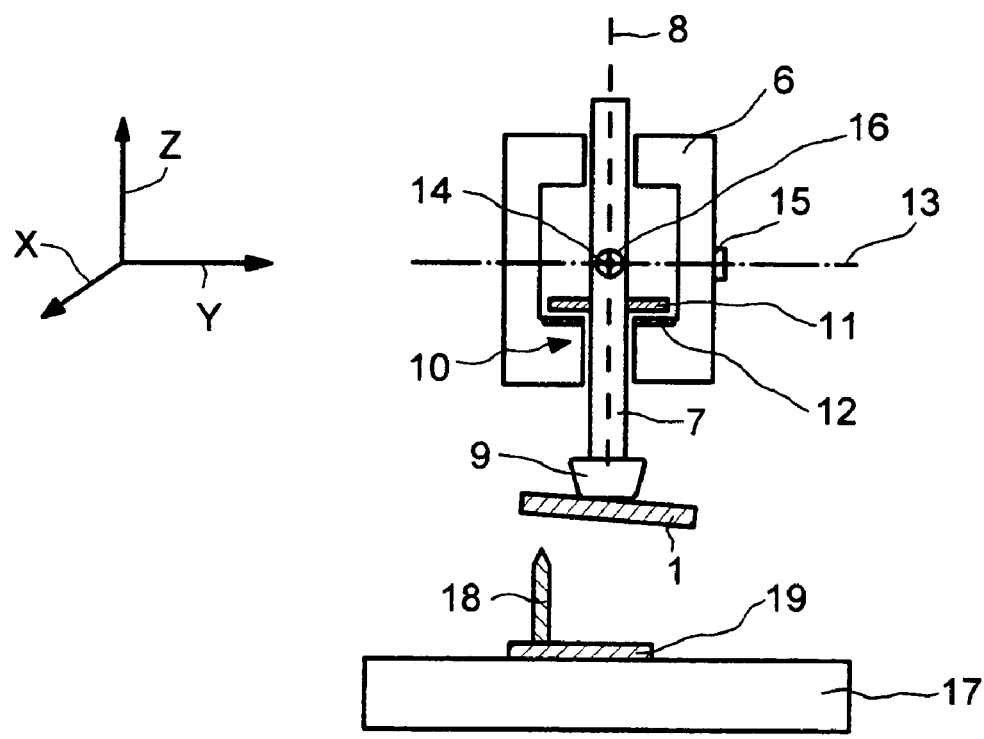
FIG. 2 shows a schematic side view of the bondhead of a Die Bonder and an auxiliary device for adjusting the bondhead.

The principle of the invention is described based on FIG. 2. FIG. 2 shows schematically a side view of the bondhead 6 of the Die Bonder. The bondhead 6 comprises a gripper 7 that can be deflected in relation to the bondhead 6 along a predetermined axis 8 and can be rotated on the predetermined axis 8. In the example, the gripper 7 is equipped with a rubber nozzle 9. Vacuum can be applied to the gripper 7 in order to pick and hold the semiconductor chip 1. The bondhead 6 is moved by the Pick and Place system 5 (FIG. 1) back and forth in x and y direction between the wafer table 4 (FIG. 1) and the bonding position above the substrate 2 (FIG. 1). On picking a semiconductor chip 1 from the wafer table 4 and on placing the semiconductor chip 1 onto the substrate 2, the gripper 7 is deflected in relation to the bondhead 6 along the predetermined axis 8 whereby the deflection of the gripper 7 acts either against the force of a spring or a pneumatically produced force. The bondhead 6 contains a sensor 10 for measuring the deflection of the gripper 7. The sensor 10 is preferably an inductive sensor that consists of a metallic plate 11 attached to the gripper 7 and a coil 12 attached to the bondhead 6. The bondhead 6 can be rotated on two axes 13 and 14 running orthogonally to each other in order to eliminate any inclination of the picked semiconductor chip 1. Rotation of the bondhead 6 on each of the axes 13 and 14 takes place by means of an adjusting screw 15 and 16 that preferably have a graduated scale whereby one rotation by one scale graduation corresponds for example to one rotation by an angle of 0.1°.

With this embodiment a measuring system is also present in order to measure the z height of the bondhead 6 in relation to the process plate 17.

In production, the substrate 2 is presented on a process plate 17 at the bonding position. To adjust the bondhead 6, a plate 19 with a protruding needle 18 is placed or temporarily secured on the process plate 17. Adjustment of the bondhead 6 takes place in accordance with the process steps explained below:

a) The bondhead picks a semiconductor chip 1.
b) The Pick and Place system 5 moves the bondhead to a first position characterised by the co-ordinates $(x_1, y_1)$ at which the semiconductor chip 1 is located above the needle 18. The bondhead 6 is lowered, preferably at a constant speed, whereby the output signal of the sensor 10 is monitored. Because, to begin with, no force acts on the semiconductor chip 1 and therefore on the gripper 7, the gripper 7 is in its resting position, ie, in a bottom limit position in relation to the bondhead 6. In the example presented in FIG. 2, the plate 11 rests in the bottom limit position on a stop face of the bondhead 6. The gripper 7 follows the lowering movement of the bondhead 6. The output signal of the sensor 10 is therefore constant. As soon as the underneath of the semiconductor chip 1 touches the needle 18, the z height of the gripper 7 no longer changes while the z height of the bondhead 6 continues to reduce: The gripper 7 is therefore deflected in relation to the bondhead 6. In this way, the output signal of the sensor 10 changes as soon as the underneath of the semiconductor chip 1 touches the needle 18. Lowering of the bondhead 6 is stopped as soon as the change in the output signal of the sensor 10 exceeds a predetermined threshold value and the bondhead 6 is raised again. The height $z_1(x_1, y_1)$ taken up by the bondhead 6 at the time at which the semiconductor chip 1 came into contact with the needle 18 is now determined from the course of the output signal of the sensor 10.
c) Step b is carried out for at least two further positions with the co-ordinates $(x_2, y_2)$ and $(x_3, y_3)$ and the corresponding values $z_2(x_2, y_2)$ and $z_3(x_3, y_3)$ are determined. The values $z_2(x_2, y_2)$ and $z_3(x_3, y_3)$ again correspond to the height taken up by the bondhead 6 at the time when, on lowering the bondhead 6, the semiconductor chip 1 came into contact with the needle 18.
d) Two angles $\alpha$ and $\beta$ are determined from the values $z_1(x_1, y_1)$, $z_2(x_2, y_2)$ and $z_3(x_3, y_3)$ whereby angle $\alpha$ designates the angle by which the bondhead 6 is turned on axis 13 in relation to its ideal position, and whereby angle $\beta$ designates the angle by which the bondhead 6 is turned on axis 14 in relation to its ideal position. Indication of the angles $\alpha$ and $\beta$ is preferably done in the units of the scale graduations of the adjusting screws.
e) The operator turns the two adjusting screws 15 and 16 by the angles $\alpha$ and $\beta$ determined in step d.

It is possible that the distance of the bondhead 6 to the process plate 17 is dependent on the co-ordinates x and y. This dependency is established on calibration of the Die Bonder. If the distance of the bondhead 6 to the process plate 17 varies locally, then the measured heights $z_1(x_1, y_1)$, $z_2(x_2, y_2)$ and $z_3(x_3, y_3)$ have to be correspondingly corrected before the angles $\alpha$ and $\beta$ are calculated in step d.

Ideally, the semiconductor chip 1 is now aligned planeparallel to the process plate 17. Steps b to e can be optionally repeated until the measurement results show that the inclination of the semiconductor chip 1 has really been eliminated.

Advantageously, the co-ordinates $(x_1, y_1)$, $(x_2, y_2)$ and $(x_3, y_3)$ are selected according to the dimensions of the semiconductor chip 1 so that the needle 18 always comes into contact with the underneath of the semiconductor chip 1 in the areas of its corners.

Figure 3:
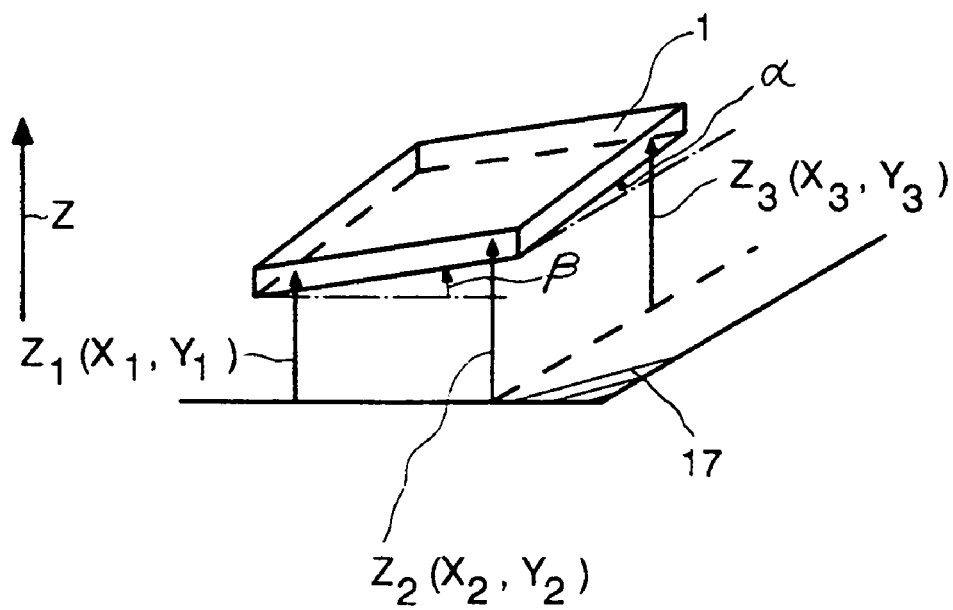
FIG. 3 shows a drawing to illustrate determining the inclination based on measured values.

FIG. 3 shows the semiconductor chip 1 in an inclined position and the three determined heights $z_1(x_1, y_1)$, $z_2(x_2, y_2)$ and $z_3(x_3, y_3)$ as well as the angles $\alpha$ and $\beta$ to be determined. In the event that $y_2 = y_1$ and $x_3 = x_2$, the angles $\alpha$ and $\beta$ are obtained from the equations:

$$\alpha = \arctan\left(\frac{z(x_2, y_2) - z(x_1, y_1)}{x_2 - x_1}\right) \quad (1)$$

$$\beta = \arctan\left(\frac{z(x_3, y_3) - z(x_2, y_2)}{y_3 - y_2}\right). \quad (2)$$

Figure 4:
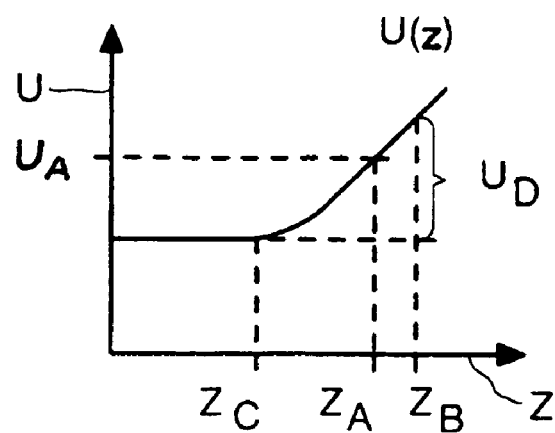
FIG. 4 shows a diagram to illustrate different possibilities for evaluating an output signal of a sensor.

To determine the angles $\alpha$ and $\beta$, the differences between two measured heights are always decisive. For this reason, it doesn't matter if the determined heights $z_1$, $z_2$ and $z_3$ show a systematic error. The height $z(x, y)$ taken up by the bondhead 6 at the time when, on lowering the bondhead 6, the semiconductor chip 1 came into contact with the needle 18 can be determined from the output signal of the sensor 10 in different equivalent ways with regard to the subtraction in the equations (1) and (2). Determining the height $z(x, y)$ for the three methods described below can be taken from FIG. 4. FIG. 4 shows the output signal $U(z)$ of the sensor 10 in relation to the height z of the bondhead 6.

a) A height $z_A(x, y)$ is determined that was taken up by the bondhead 6 on lowering when the output signal U of the sensor 10 achieved a predetermined absolute value $U_A$.
b) A height $z_B(x, y)$ is determined that was taken up by the bondhead 6 on lowering when the output signal of the sensor 10 increased by a predetermined value $U_D$ in relation to the value at the start of lowering, ie, the value corresponding to the resting position of the gripper 7.
c) The deflection of the gripper 7 from the resting position acts against frictional forces between the gripper 7 and the bondhead 6. This means that the output signal $U(z)$ is non-linear in the area of the resting position. The form of the output signal $U(z)$ can be determined by a calibration measurement so that a height $z_C(x, y)$ can be determined from the measured course of the output signal that corresponds to the effective height taken up by the bondhead 6 at which, on lowering the bondhead 6, the semiconductor chip 1 came into contact with the needle 18.

In this sense, the instruction "Determining a height $z_1(x_1, y_1)$ taken up by the bondhead (6) at the time when the semiconductor chip (1) came into contact with the needle (18) from the output signal of the sensor (10)" means determining the height $z_1(x_1, y_1)$ according to one of the above-mentioned or a further equivalent method, ie, it can be that $z_1(x_1, y_1) = z_A$ or $z_1(x_1, y_1) = z_B$ or $z_1(x_1, y_1) = z_C$.

From the U.S. patent application published as US 2003-101576, incorporated by reference as fully set forth and disclosed herein, a bondhead with a gripper is known with which the bondhead can not be raised and lowered in z direction but with which only the gripper can carry out a movement in z direction. Movement of the gripper takes place pneumatically. The invention can also be used in this case whereby the gripper is lowered instead of the bondhead. At the start of lowering, the output signal of the inductive sensor changes because the deflection of the gripper changes in relation to the bondhead. The height $z(x, y)$ is now determined at which the lowering movement of the gripper is stopped because the needle comes into contact with the semiconductor chip. Under ideal conditions, this height is reached when the output signal of the sensor has achieved a constant value.

Although the adjustment of the bondhead is preferably done by means of one of the semiconductor chips to be mounted, a plate made from plastic or metal for example can be picked instead of the semiconductor chip and the adjustment carried out with this plate.

To determine the inclination of the semiconductor chip, it suffices to determine three heights. If four heights are determined, for example the heights of the four corners of the semiconductor chip, then the measuring error can be limited to a minimum.

Up to now, the invention has been explained on the example of a Die Bonder with which the bondhead 6 (FIG. 2) is moved in x and y direction in order to position each corner of the semiconductor chip 1 above the needle 18. If the technically possible travel of the bondhead 6 is insufficient for these movements, then of course the needle 18 can be moved instead of the bondhead 6 in that either the plate 19 with the protruding needle 18 is moved manually or the plate 19 is mounted onto an xy table in order to move the plate 19 on the process plate 17 with great precision in x and y direction.

Furthermore, it is necessary to know the position of the semiconductor chip 1 in relation to the tip of the needle 18. As a rule, the Die Bonder has two cameras the first camera serving to determine the position of the semiconductor chip 1 presented on the wafer table 4 in relation to the axis 8 and the second camera arranged above the bonding location serving to determine the position of the substrate 2 in relation to the axis 8. The position of the tip of the needle 18 can therefore be determined with the second camera. Therefore, all necessary information is available on the one hand in order to select and approach with great accuracy optimum co-ordinates $(x_1, y_1)$, $(x_2, y_2)$ and $(x_3, y_3)$ and, on the other hand, to ensure that, on lowering, the semiconductor chip 1 impacts on the needle 18 and that the position of the edges of the semiconductor chip 1 is known relative to the three co-ordinates $(x_1, y_1)$, $(x_2, y_2)$ and $(x_3, y_3)$ so that the two angles $\alpha$ and $\beta$ can be calculated correctly.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. A method for adjusting the bondhead of a Die Bonder, whereby the Die Bonder comprises a bondhead with a gripper deflectable in a predetermined direction in relation to the bondhead, comprising the following steps:
   a) Picking a semiconductor chip or a plate with the gripper of the bondhead;
   b) Moving the bondhead to a position characterised by co-ordinates $(x_1, y_1)$ that is determined so that the semiconductor chip is located above a needle;
   c) Lowering the bondhead whereby the gripper is located in a bottom limit position in relation to the bondhead and monitoring the output signal of a sensor the output signal of which is dependent on the degree of deflection of the gripper in relation to the bondhead;
   d) Determining a height $z_1(x_1, y_1)$ taken up by the bondhead at the time when the semiconductor chip came into contact with the needle from the output signal of the sensor;
   e) Repeating steps b to d for at least two further positions characterised by co-ordinates $(x_2, y_2)$ and $(x_3, y_3)$ and determining the corresponding values $z_2(x_2, y_2)$ and $z_3(x_3, y_3)$ that again correspond to the heights at positions $(x_2, y_2)$ and $(x_3, y_3)$ taken up by the bondhead at the time when the semiconductor chip, on lowering the bondhead, came into contact with the needle;
   f) Determining two angles $\alpha$ and $\beta$ from the values $z_1(x_1, y_1)$, $z_2(x_2, y_2)$ and $z_3(x_3, y_3)$, whereby angle $\alpha$ designates the angle by which the semiconductor chip is rotated on a first axis in relation to its ideal position, and whereby angle $\beta$ designates the angle by which the semiconductor chip is rotated on a second axis in relation to its ideal position;
   g) Adjusting the bondhead according to the angles $\alpha$ and $\beta$ determined in step f.

2. A method for adjusting the bondhead of a Die Bonder, whereby the Die Bonder comprises a bondhead with a gripper deflectable in a predetermined direction in relation to the bondhead, comprising the following steps:
   a) Picking a semiconductor chip or a plate with the gripper of the bondhead;
   b) Moving the bondhead to a position characterised by co-ordinates $(x_1, y_1)$ that is determined so that the semiconductor chip is located above a needle;
   c) Lowering the gripper and monitoring the output signal of a sensor the output signal of which is dependent on the degree of deflection of the gripper in relation to the bondhead;
   d) Determining a height $z_1(x_1, y_1)$ taken up by the gripper at the time when the semiconductor chip came into contact with the needle from the output signal of the sensor;
   e) Repeating steps b to d for at least two further positions characterised by co-ordinates $(x_2, y_2)$ and $(x_3, y_3)$ and determining the corresponding values $z_2(x_2, y_2)$ and $z_3(x_3, y_3)$ that again correspond to the heights at positions $(x_2, y_2)$ and $(x_3, y_3)$ taken up by the gripper at the time when the semiconductor chip, on lowering the gripper, came into contact with the needle;
   f) Determining two angles $\alpha$ and $\beta$ from the values $z_1(x_1, y_1)$, $z_2(x_2, y_2)$ and $z_3(x_3, y_3)$, whereby angle $\alpha$ designates the angle by which the semiconductor chip is rotated on a first axis in relation to its ideal position, and whereby angle $\beta$ designates the angle by which the semiconductor chip is rotated on a second axis in relation to its ideal position;
   g) Adjusting the bondhead according to the angles $\alpha$ and $\beta$ determined in step f.

* * * * *